(12) United States Patent
    Afzalian

(10) Patent No.: US 12,154,979 B2
(45) Date of Patent: Nov. 26, 2024

(54) DYNAMICALLY DOPED FIELD-EFFECT TRANSISTOR AND A METHOD FOR CONTROLLING SUCH

(71) Applicant: IMEC VZW, Leuven (BE)

(72) Inventor: Aryan Afzalian, Leuven (BE)

(73) Assignee: IMEC VZW, Leuven (BE)

( * ) Notice: Subject to any disclaimer, the term of this patent is extended or adjusted under 35 U.S.C. 154(b) by 376 days.

(21) Appl. No.: 17/496,186

(22) Filed: Oct. 7, 2021

(65) Prior Publication Data

US 2022/0115523 A1  Apr. 14, 2022

(30) Foreign Application Priority Data

Oct. 8, 2020  (EP) ..................................... 20200764

(51) Int. Cl.
    *H01L 29/772*  (2006.01)
    *H03K 17/687* (2006.01)

(52) U.S. Cl.
    CPC ....... *H01L 29/7722* (2013.01); *H03K 17/687* (2013.01)

(58) Field of Classification Search
    CPC ........... H01L 29/7722; H01L 29/42392; H01L 29/78696; H01L 29/41733; H01L 29/78648; H01L 29/42384; H01L 29/78618; H01L 29/0684; H01L 29/0847; H01L 29/1033; H01L 29/42356; H01L 29/66568; H01L 29/78; H03K 17/687
    See application file for complete search history.

(56) References Cited

U.S. PATENT DOCUMENTS

| | | | |
|---|---|---|---|
| 9,293,536 B2* | 3/2016 | Nourbakhsh | ..... H01L 29/42384 |
| 2011/0084262 A1 | 4/2011 | Kondratyuk et al. | |
| 2012/0305893 A1* | 12/2012 | Colinge | ............ H01L 29/78696 |
| | | | 257/29 |
| 2014/0231773 A1* | 8/2014 | Suraru | ................. C07D 471/22 |
| | | | 257/40 |
| 2015/0364472 A1 | 12/2015 | Kim et al. | |
| 2015/0380440 A1 | 12/2015 | Hekmatshoartabari et al. | |

(Continued)

FOREIGN PATENT DOCUMENTS

| | | |
|---|---|---|
| CN | 110649092 A | 1/2020 |
| EP | 0444712 A1 | 9/1991 |
| EP | 2911204 A1 | 8/2015 |

OTHER PUBLICATIONS

Sangeeta Singh, Ruchir Sinha, P.N. Kondekar, "A novel ultra steep dynamically configurable electrostatically doped silicon nanowire Schottky Barrier FET," Superlattices and Microstructures, vol. 93, p. 40-49 (Year: 2016).*

(Continued)

*Primary Examiner* — Peter M Albrecht
(74) *Attorney, Agent, or Firm* — MOSER TABOADA

(57) ABSTRACT

A field-effect transistor and a method for controlling such is provided herein. The field-effect transistor includes a source terminal and a drain terminal arranged on a first side of a semiconductor layer and a single gate arranged on a second side of the semiconductor layer opposite the first side. The gate and the source terminal are arranged to overlap with a first common region of the semiconductor layer and the gate and the drain terminal are arranged to overlap with a second common region of the semiconductor layer.

11 Claims, 6 Drawing Sheets

(56) References Cited

U.S. PATENT DOCUMENTS

| | | |
|---|---|---|
| 2016/0118411 A1 | 4/2016 | Kao et al. |
| 2016/0343743 A1 | 11/2016 | Tang |
| 2018/0158845 A1 | 6/2018 | Liao et al. |
| 2019/0080967 A1 | 3/2019 | Thompson et al. |
| 2023/0275125 A1* | 8/2023 | Xu .................... H01L 29/0673 257/288 |

OTHER PUBLICATIONS

Robbins, M. C. et al., "Black Phosphorus p- and n-MOSFETs With Electrostatically Doped Contacts," IEEE Electron Device Letters, vol. 38, No. 2, pp. 285-288, Feb. 2017. (Year: 2017).*

Wessely et al., "Reconfigurable CMOS with undoped silicon nanowire midgap Schottky-barrier FETs", Microelectronics Journal 44 (2013) 1072-1076.

Kim et al., "Highly tunable local gate controlled complementary graphene device performing as inverter and voltage controlled resistor", Oct. 4, 2013;24(39):395202. doi: 10.1088/0957-4484/24/39/395202.

Lahgere et al., "Electrically doped dynamically configurable field-effect transistor for lowpower and high-performance applications", Electronics Letters • Jul. 2015, DOI: 10.1049/el.2015.0079.

Sangeeta Singh et al., "A novel ultra steep dynamically reconfigurable electrostatically doped silicon nanowire Schottky Barrier FET", Superlattices and Microstructures, vol. 93, May 2016, pp. 40-49, Mar. 2016, DOI: 10.1016/j.spmi.2016.02.039.

* cited by examiner

DYNAMICALLY DOPED FIELD-EFFECT TRANSISTOR AND A METHOD FOR CONTROLLING SUCH

CROSS REFERENCE TO RELATED APPLICATIONS

This application claims benefit of European Application No. EP20200764.7 filed on Oct. 8, 2020, which is herein incorporated by reference in its entirety.

TECHNICAL FIELD

The present inventive concept relates to a dynamically doped field-effect transistor and a method for controlling such a field-effect transistor.

BACKGROUND

Moore's law, that sets the footprint area of a transistor to scale by a factor 2, i.e. the transistor gate length L to scale by a factor √2, every 2 years, has been the driving force of the electronic industry, scaling the length of a transistor to its limits. Today, the minimal distance between the gate of two subsequent transistors, the gate pitch (CGP), has been scaled well below 20 nm and further scaling has become increasingly difficult due to short-channel effects (SCE) that degrade the subthreshold slope (SS) of a transistor (i.e. the efficiency with which the current is switched from off to on state by changing the gate bias). SCE lead to an increased off-state leakage current, $I_{OFF}$. To mitigate SCE, i.e., to keep a good electrostatic control of the gate over the transistor channel, the thickness of the transistor channel, $t_s$, has to be scaled as well.

FIG. 1 is a schematic view of an example prior art three-terminal field-effect transistor. The transistor comprises a semiconductor layer with a source terminal S, drain terminal D and gate terminal G all arranged on the same side of the semiconductor layer.

In order to sufficiently electrically separate the three terminals of the prior art transistor, they have a spacer distance denoted $L_S$ between them.

The source and drain regions of the prior art transistor are doped to increase the drive current. The doping level of the source and drain regions is indicated by $N_{SD}$ in FIG. 1. $N_{SD}$ must be balanced to allow for a good drive current but a low enough $N_{SD}$ to allow for a good SS.

A channel is induced in the region of the semiconductor layer below the gate of the prior art transistor. The doping of the source and drain regions further allows for a charge-carrier concentration that enables the charge carriers to bridge the $L_S$ region between the channel region and the source and drain regions, respectively.

Transistors have evolved from planar single-gate transistors to 3D multi-gate devices such as FINFETs, nanowire transistors and nanosheet transistors. As a rule of thumb, in a multi-gate device, the channel thickness $t_s$ may be of the order of ½ L in order to keep the electrostatic integrity, leading to a $t_s$ of only a few nm in modern advanced nanoscale technologies.

It is commonly accepted that conventional dimensional scaling will stop for L of the order of 12 nm. It would be very desirable to create a transistor capable of scaling towards and even beyond this limit that mitigates problems introduces at this scale, e.g. the SCE and SS degradation.

SUMMARY

An objective of the present inventive concept is to provide a transistor structure capable of scaling while mitigating problems introduced at a small scale.

According to a first aspect of the present inventive concept there is provided a field-effect transistor. The field-effect transistor comprises: a semiconductor layer; a source terminal, a drain terminal and a single gate; wherein the source and drain terminals are arranged on a first side of the semiconductor layer and the gate is arranged on a second side of the semiconductor layer opposite the first side; wherein the semiconductor layer comprises a source region along which the source terminal abuts the semiconductor layer and a drain region along which the drain terminal abuts the semiconductor layer; wherein the gate and the source terminal are arranged to overlap with a first common region of the semiconductor layer and the gate and the drain terminal are arranged to overlap with a second common region of the semiconductor layer, the first common region forming a sub-region of the source region and the second common region forming a sub-region of the drain region, wherein the source region further comprises a first gap region which the gate does not overlap and the drain region further comprises a second gap region which the gate does not overlap; and wherein the gate is configured to, when the field-effect transistor is switched to an active state, induce an electrostatic doping of the first and second common regions of the semiconductor layer and induce a channel in a channel region of the semiconductor layer, extending between the first and second common regions.

According to the inventive concept, the source and drain terminals may be arranged closer together than in prior art devices with all terminals on one side of the semiconductor layer. Thereby a length of the device may be reduced while ensuring that the terminals of the device are sufficiently separated to be individually controllable. Furthermore, the channel induced extends along the entire subregion of the semiconductor layer between the source and drain regions, thereby enabling a reduced SCE when scaling the device down. Compared to the prior art transistor design discussed in the background, the channel region of the semiconductor layer may according to the inventive concept be longer while the remaining device dimensions are kept the same, as no $L_S$ region is required.

Additionally, by the gate extending into the first and second common regions, the voltage applied to the gate when the field-effect transistor is switched to an active state induces an electrostatic doping of the first and second common regions of the semiconductor layer, thereby effectively increasing the doping concentration of a region below the source and drain terminals and increasing the drive current of the field-effect transistor.

A lower (chemical) doping level of the first and second common regions may hence be used than for the (typically highly chemically doped) source and drain regions of the prior art transistor design, which in turn may reduce the degradation of the SS as the device scales down.

Thereby, dynamic doping is achieved by controlling the electrostatic doping level of the first and second common regions of the semiconductor layer via the voltage applied to the gate.

The first and second gap regions may enable the gates of adjacent devices to be separated to be individually controlled.

The term "terminal" is herein used to refer to one of the terminals of the field-effect transistor, i.e. a source terminal, a drain terminal or gate terminal thereof. Although "terminal" refers to a single terminal, a single terminal may be formed by two or more portions, wherein all portions of the single terminal are electrically connected and jointly controllable with the same electrical signal.

The field-effect transistor may be a three-terminal field-effect transistor, i.e. comprising a single source terminal, a single drain terminal and a single gate terminal.

However, the field-effect transistor may further comprise additional terminals, such as a body terminal. For a field-effect transistor it is common practice to tie/electrically couple the body terminal to the source terminal or drain terminal to ensure no body bias. In any case, the field-effect transistor however only comprises a single gate configured to induce an electrostatic doping of the first and second common regions of the semiconductor layer and induce a channel in a channel region of the semiconductor layer.

The first and second side of the semiconductor layer may refer to any of the sides of the semiconductor layer, for example the lower and upper main surface of the layer, i.e. the sides normal to the plane of the layer or any of the opposite sidewalls along the edges of said layer.

The term "electrostatic doping" is herein used to refer to increasing the carrier concentration of the semiconductor by applying a voltage over the semiconductor. The carriers added may be electrons or holes, depending on the voltage applied. When increasing the carrier concentration when the carrier is holes, a negative voltage is applied, which lowers the electron concentration and thereby increases the hole concentration.

The term "channel" is herein used to refer to an induced current flow, i.e. an increased carrier concentration, between the source and drain terminals.

When the field-effect transistor is in an active state, a voltage is applied to the gate. The voltage may e.g. be in the magnitude of 0.1 V or 1 V. The voltage may be positive or negative depending on the type of charge carriers of the field-effect transistor.

The source region refers to the region of the semiconductor layer which the source terminal overlaps, i.e. along which the source terminal extends. The source region is coextensive with the source terminal.

The drain region refers to the region of the semiconductor layer which the drain terminal overlaps, i.e. along which the drain terminal extends. The drain region is coextensive with the drain terminal.

According to one embodiment, the first and second common regions have a respective first doping level when the transistor is inactive, and a respective electrostatically increased second doping level when the transistor is active.

By having a lower doping level when the transistor is inactive, compared to when it is active, SCE such as current leakage and a poor SS may be mitigated as the carrier concentration is relatively low when the transistor is inactive. By having a higher doping level when the transistor is active, compared to when it is inactive, a higher drive current may be achieved.

A balancing of the doping level for the respective first and second common regions may therefore be optimized by the doping level dynamically increasing when a higher doping level is beneficial and dynamically decreasing when a lower doping level is beneficial.

According to one embodiment, the first doping level is lower than a chemical or intrinsic doping level of the un-gated semiconductor layer.

The term "intrinsic doping level" is herein used to refer to the semiconductor being undoped, i.e. having a doping level that has not been chemically changed using doping techniques.

The term "doping level of the un-gated semiconductor layer" is herein used to refer to the doping level of the semiconductor layer, disregarding any influence thereon by the terminals or the gate of the field-effect transistor, such as the doping level of the semiconductor layer before terminals have been added to the transistor.

The gate bias when the transistor is inactive may electrostatically deplete the first and second common regions. This further lowers the doping level of the first and second common regions when the transistor is inactive, which further mitigates SCE such as a poor SS.

According to one embodiment, the semiconductor layer is formed with a uniform doping level.

The term "uniform" is herein used to refer to the entire semiconductor layer having substantially the same doping level before the terminals of the field-effect transistor are formed.

The uniform doping level may be a chemical or intrinsic doping level.

Chemical doping of specific regions of the semiconductor layer may be hard to control at the small dimensions proposed for the field-effect transistor, e.g. because the added charge carriers may diffuse beyond the intended area. A uniform doping level thereby simplifies the requirements of the device.

According to one embodiment, the semiconductor layer is an intrinsically doped semiconductor layer.

By having a uniform intrinsic doping level of the semiconductor layer, further processing to chemically dope the semiconductor layer is not necessary.

Different separations of the source and drain terminals are envisaged: The source and drain terminals may for example be at most 24 nm apart, at most 22 nm apart, or at most 20 nm apart.

The term "apart" is herein used to refer to the distance between the closest ends of the source and drain terminals.

According to one embodiment, the semiconductor layer is a thin-film layer. The term "thin-film layer" may be used to refer to the semiconductor layer being thinner than 20 nm. Such a thin layer may allow for the source and drain terminals to be affected by a relatively low applied voltage over the gate, despite them being arranged on opposite sides of the semiconductor layer.

According to one embodiment, the gate comprises a first gate portion extending along the second side of the semiconductor layer, and a second gate portion arranged along another side of the semiconductor layer, the first and second gate portions being controlled via a same gate terminal.

The term "another side" is herein used to refer to a side different from the second side, i.e. the first side or a side perpendicular to the first and second sides. The gate may thereby comprise gate portions on the first and second side, on the second side and at least one sidewall of the semiconductor layer, or the first side, second side and both sidewalls of the semiconductor layer.

The second gate portion may have a different size and extension than the first game portion.

The term "a same gate terminal" is herein used to refer to one of the terminals of the field effect transistor, i.e. the gate terminal as previously disclosed. The two (or more) gate portions are electrically connected portions of the gate, i.e. both portions of the single gate are jointly controlled with the same electrical signal via the single gate terminal.

By the gate comprising a plurality of portions, a better electrostatic control may be achieved, e.g. when inducing a channel in the channel region. The gate portions may together form an all-around gate.

According to one embodiment, the semiconductor layer forms a first semiconductor layer and the field-effect transistor further comprises a second semiconductor layer having a first side and a second side; wherein the source terminal comprises a first source portion and the drain terminal comprises a first drain portion, both arranged on the first side of the first semiconductor layer; wherein the gate is arranged on the second side of the second semiconductor layer; and the field-effect transistor further comprises a second source portion and a second drain portion arranged on the first side of the second semiconductor layer and extending along a source region and a drain region respectively of the second semiconductor layer, the first and second source portions being controlled via a same source terminal and the first and second drain portions being controlled via a same drain terminal.

The term "a same source terminal" is herein used to refer to one of the terminals of the field effect transistor, i.e. the source terminal as previously disclosed. The two (or more) source portions are electrically connected portions of the source terminal, i.e. both portions of the single source terminal are jointly controlled with the same electrical signal.

The term "a same drain terminal" is herein used to refer to one of the terminals of the field effect transistor, i.e. the drain terminal as previously disclosed. The two (or more) drain portions are electrically connected portions of the drain terminal, i.e. both portions of the single drain terminal are jointly controlled with the same electrical signal.

The second semiconductor layer may be arranged above or below the first semiconductor layer, parallel with each other. The gate is arranged on the second side of the first and second semiconductor layer and affects both the semiconductor layers, the shared gate may therefore define a mirror plane of the structure.

By the use of two semiconductor layers thusly arranged, the gate may, when the field-effect transistor is switched to the active state, induce an electrostatic doping of the first and second common regions of both the first and second semiconductor layers and induce a channel in a respective channel region of both the first and the second semiconductor layers.

Hence, the gate may control the doping and the flow of charges through the first and second semiconductor layers, thereby effectively doubling the drive current of the field-effect transistor.

Additional semiconductor layers may be added in an analogous manner to create a multi-layer device.

According to one embodiment, the semiconductor layer forms a first semiconductor layer and the field-effect transistor further comprises a third semiconductor layer having a first side and a second side; wherein the source terminal and drain terminal are arranged on the first side of the third semiconductor layer; and the gate comprises a first gate portion extending along the second side of the first semiconductor layer and a third gate portion extending along the second side of the third semiconductor layer, the first and third gate portions being controlled via a same gate terminal; and wherein the third gate portion is arranged to overlap with a first common region and a second common region of the third semiconductor layer, the first common region forming a sub-region of a source region of the third semiconductor layer and the second common region forming a sub-region of a drain region of the third semiconductor layer, wherein the source region of the third semiconductor layer further comprises a first gap region which the third gate portion does not overlap and the drain region of the third semiconductor layer further comprises a second gap region which the third gate portion does not overlap.

The third semiconductor layer may be arranged above or below the first semiconductor layer, parallel with each other. The source terminal and drain terminal are arranged on the first side of the first and second semiconductor layer and affects both the semiconductor layers, the shared source and drain terminals may therefore define a mirror plane of the structure.

The source region of the third semiconductor layer is the region of the third semiconductor layer along which the source terminal extends and may be coextensive with the source terminal.

The drain region of the third semiconductor layer is the region of the third semiconductor layer along which the drain terminal extends and may be coextensive with the drain terminal.

By the use of two semiconductor layers thusly arranged, the gate may, when the field-effect transistor is switched to the active state, induce an electrostatic doping of the respective first and second common regions of both the first and third semiconductor layers and induce a channel in a respective channel region of both the first and the third semiconductor layers.

Hence, the gate may control the doping and the flow of charges through the first and third semiconductor layers, thereby effectively doubling the drive current of the field-effect transistor.

Additional semiconductor layers may be added in an analogous manner to create a multi-layer device.

According to another aspect of the present inventive concept a field-effect transistor arrangement is provided. The field-effect transistor arrangement comprises a first field-effect transistor according to the first aspect of the present inventive concept.

The field-effect transistor arrangement further comprises a second field-effect transistor according to the first aspect of the present inventive concept.

The first and second field-effect transistors are arranged along the same semiconductor layer; wherein the first gap region of the second field-effect transistor is adjacent the first or second gap region of the first field-effect transistor; and wherein the respective gate of the first and second field-effect transistor is configured to be individually controlled.

The respective gate of the first and second field-effect transistors are separated by the adjacent gap regions, together forming a region of the common semiconductor layer of the field-effect transistor arrangement without a gate terminal, such that each of the adjacent gate terminals are electrically separate and may be individually controllable without leakage or interference.

The second gap region of the second field-effect transistor may be adjacent to the first or second gap region of a third field-effect transistor, thereby extending the field-effect transistor arrangement.

The field-effect transistor arrangement may comprise any number of field-effect transistors greater than one along a common semiconductor layer.

According to one embodiment of the field-effect transistor arrangement, the source terminal of the second field-effect transistor and the source or drain terminal of the first field-effect transistor are integrally formed.

The term "integrally formed" is herein used to refer to a terminal common to both the first and second field-effect transistor and jointly controlling the source and/or drain terminal of the first and second field-effect transistor with the same electrical signal.

The integrally formed terminal may have an extension corresponding to one or two source and/or drain terminals.

According to another aspect of the present inventive concept a method for controlling a field-effect transistor is provided. The field-effect transistor comprises a semiconductor layer, a source terminal, a drain terminal and a single gate; wherein the source and drain terminals are arranged on a first side of the semiconductor layer and the gate is arranged on a second side of the semiconductor layer opposite the first side; wherein the semiconductor layer comprises a source region along which the source terminal abuts the semiconductor layer and a drain region along which the drain terminal abuts the semiconductor layer; wherein the gate and the source terminal are arranged to overlap with a first common region of the semiconductor layer and the gate and the drain terminal are arranged to overlap with a second common region of the semiconductor layer, the first common region forming a sub-region of the source region and the second common region forming a sub-region of the drain region, wherein the source region further comprises a first gap region which the gate does not overlap and the drain region further comprises a second gap region which the gate does not overlap.

The method comprises a step of switching the field-effect transistor structure to an active state by increasing a voltage of the gate, which induces an electrostatic doping of the first and second common regions of the semiconductor layer and induces a channel in a channel region of the semiconductor layer, extending between the first and second common regions.

By jointly inducing the amount of electrostatic doping of the first and second common regions and inducing the channel in the channel region with the same step of switching the field-effect transistor to an active state, dynamic doping may be achieved in conjunction with control of the transistor.

All of the above disclosed examples, details and advantages may be applied also to the method in an analogous manner.

According to one embodiment of the method, the method further comprises a step of switching the field-effect transistor to an inactive state by controlling a voltage of the gate, which reduces the amount of electrostatic doping of the first and second common regions of the semiconductor layer and stops inducing the channel in the channel region of the semiconductor layer, extending between the first and second common regions.

By jointly reducing the amount of electrostatic doping of the first and second common regions and stopping inducing the channel in the channel region with the same step of switching the field-effect transistor to an inactive state, dynamic doping may be achieved in conjunction with control of the transistor.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

DETAILED DESCRIPTION

Figure 1:
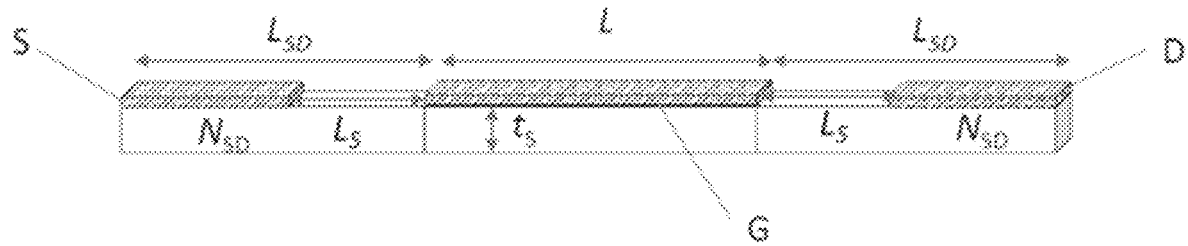
FIG. 1 is a schematic view of a prior art field-effect transistor.

FIG. 1 is a schematic view of a prior art three-terminal field-effect transistor. The transistor comprises a semiconductor layer with a source terminal S, drain terminal D and gate terminal G all arranged on the same side of the semiconductor layer.

In order to sufficiently electrically separate the three terminals of the prior art transistor, they have a spacer distance denoted $L_S$ between them. The spacer distance may correspond to at least 6 nm. This is a typical $L_S$ value forecast by the international roadmap for devices and systems (IRDS).

Figure 2:
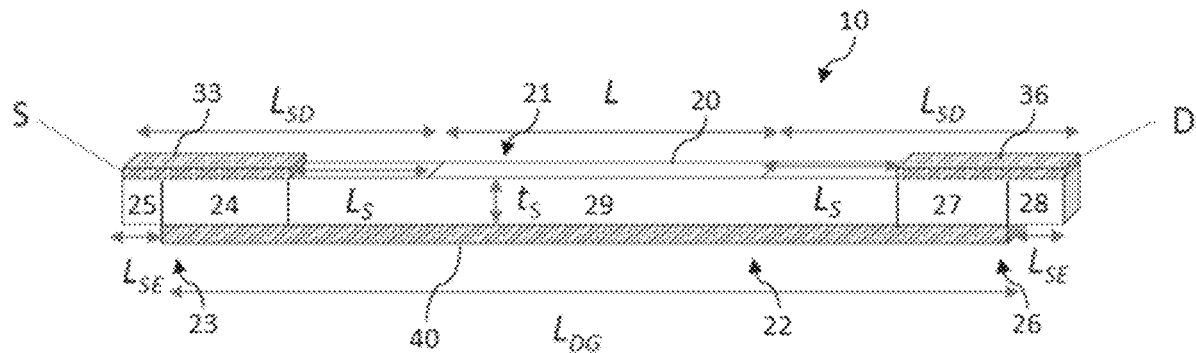
FIG. 2 is a schematic view of a field effect transistor according to the present inventive concept.

The gate has a gate length denoted L in FIGS. 1-2. This length may theoretically be reduced to around 12 nm before SCE become too problematic.

The source and drain terminals may have a minimum length of around 8 nm, which corresponds to a typical $L_S$ value forecast by IRDS. This is a length that introduces a sufficient amount of charge carriers while also being relatively easy to align and connect to.

The total length of the prior art transistor is $L+2 L_{SD}=40$ nm, where $L_{SD}$ corresponds to the minimum length of the source and drain terminals and the spacer distance, i.e. at least 14 nm.

The minimum length of the prior art transistor is thereby roughly as shown, and further scaling may require different structures.

The source and drain regions of the prior art transistor are doped to increase the drive current. The doping level of the source and drain regions is indicated by $N_{SD}$ in FIG. 1, which may e.g. be in the magnitude of $10^{20}$ cm$^{-3}$.

FIG. 2 is a schematic view of a three-terminal field effect transistor (FET) 10 according to the present inventive concept. The three-terminal field effect transistor 10 is shown at the same scale as the prior art transistor of FIG. 1.

The three-terminal field effect transistor 10 comprises a semiconductor layer 20; a source terminal 33, a drain terminal 36 and a single gate 40. The source and drain terminals 33, 36 are arranged on a first side 21 of the semiconductor layer 20 and the gate 40 is arranged on a second side 22 of the semiconductor layer 20 opposite the first side 21.

The semiconductor layer 20 comprises a source region 23 along which the source terminal 33 abuts the semiconductor layer 20 and a drain region 26 along which the drain terminal 36 abuts the semiconductor layer 20.

The gate 40 and the source terminal 33 are arranged to overlap with a first common region 24 of the semiconductor layer 20 and the gate 40 and the drain terminal 36 are arranged to overlap with a second common region 27 of the semiconductor layer 20, the first common region 24 forming a sub-region of the source region 23 and the second common region 27 forming a sub-region of the drain region 26, wherein the source region 23 further comprises a first gap region 25 which the gate 40 does not overlap and the drain region 26 further comprises a second gap region 28 which the gate 40 does not overlap.

The gate 40 is connected to a gate terminal of the three terminal FET, that is, the gate 40 is controlled by a gate voltage applied to the gate terminal. In this embodiment where the gate 40 is formed of a single portion, the gate 40 may be considered to represent the gate terminal.

The gate 40 is configured to, when the field-effect transistor 10 is switched to an active state, induce an electrostatic doping of the first and second common regions 24, 27 of the semiconductor layer 20 and induce a channel in a channel region 29 of the semiconductor layer 20, extending between the first and second common regions 24, 27.

The semiconductor layer 20 may be formed by patterning (e.g. etching) bulk Si or SOI or using layer deposition, e.g. atomic layer deposition (ALD), molecular layer deposition (MLD), physical vapor deposition (PVD) or chemical vapor deposition (CVD). The semiconductor layer 20 may be made from silicon, germanium, silicon germanium or any III-V compound semiconductor, such as gallium arsenide, indium phosphate or Indium Gallium Zinc Oxide (IGZO), or any 2D material, such as black phosphorus, or transition metal dichalcogenides such as $MoS_2$, $WS_2$, $HfS_2$, $ZrS_2$, or $MoSe_2$, $WSe_2$, $WSe_2$, $HfSe_2$, $ZrSe_2$. The semiconductor layer 20 may have any shape, such as a sheet shaped like an oblong rectangle, or a nanowire.

The source terminal 33 and drain terminal 36 may be formed using sputtering, evaporation or any of the above-mentioned layer deposition methods. The source and drain terminals 33, 36 may be made from a metal such as Al, Cu, W, Ti, Ru, Pt, Au, Co, and their alloys, or using a 2D material or silicides.

The gate 40 may be formed using layer deposition, e.g. ALD, MLD, PVD or CVD. The gate 40 may be made from a gate metal such as Al, Ta, TaN, Nb, WN or $RuO_2$, or using polysilicon. The gate 40 may be formed on a dielectric interface to the semiconductor (i.e. a gate dielectric). The dielectric may be formed using layer deposition. The dielectric may be a high-k dielectric, i.e. having a dielectric constant greater than silicon oxide, such as $HfO_2$, $ZrO_2$, $Al_2O_3$, SiN or $TiO_2$.

The gate 40 may be formed extending along the entire length of the FET and subsequently removed from overlapping with the source region 33 and drain region 36 at the first and second gap regions 25, 28, e.g. by gate patterning techniques, such as etching the unwanted part of the gate 40 while masking the rest of the gate 40, or by a replacement metal gate flow.

Alternatively, the gate 40 may be formed not overlapping with the source and drain regions 33, 36, e.g. while masking the first and second gap regions 25, 28 while the gate 40 is formed.

In the following, an illustrative example is shown of a transistor 10 whereby the lengths of e.g. the terminals are selected to correspond to the IRDS values used in the prior art transistor of FIG. 1 in order to facilitate a comparison between the present inventive concept and the prior art. Other values for lengths may be chosen depending on the embodiment.

According to the example, the source and drain terminals 33, 36 each have a length of 8 nm, which corresponds to a typical value forecast by IRDS. This is a minimum length that enables an introduction of a sufficient amount of charge carriers while also being relatively easy to align and connect to.

The source and drain terminals 33, 36 are 24 nm apart. The length of the gate 40 ($L_{DG}$) is 34 nm, which corresponds to the entire length of the transistor 10 (40 nm) except for combined length of the first and second gap regions 25, 28 ($L_{SE}$), which is 3+3=6 nm. Thereby, the channel that is induced in the channel region 29 of the semiconductor layer 20 is induced along the entire subregion of the semiconductor layer 20 between the source and drain regions 23, 26. This is in contrast to the prior art transistor of FIG. 1, where the channel region does not comprise the $L_S$ regions.

Because of the gate 40 extending between the source and drain regions 23, 26 and also overlapping them, a misalignment of the gate 40 may have a reduced impact on the channel region 29, such that the channel still is induced along the entire sub-region of the semiconductor layer 20 between the source and drain regions 23, 26 regardless of a slight misalignment.

The first and second common regions 24, 27 each have a length of 5 nm. This corresponds to the length of the source and drain regions 23, 26, which are respectively coextensive with the source and drain terminals 33, 36, minus the length of the first and second gap regions 25, 28: 8−3=5 nm.

The minimum length of the source and drain regions 23, 26 is limited by the minimum length of the source and drain terminals 33, 36. However, by the use of gap regions 25, 28, the first and second common regions 24, 27 are smaller than the source and drain regions 23, 26.

The gap regions 25, 28 each have a length of 3 nm. By arranging adjacent transistors 10 such that their respective gap regions are adjacent, a distance of 6 nm between each respective gate 40 of the adjacent transistors 10 is achieved, which corresponds to a typical $L_S$ value as forecast by IRDS.

The first and second common regions 24, 27 may have a respective first doping level when the transistor 10 is inactive, and a respective electrostatically increased second doping level when the transistor 10 is active.

When the transistor 10 is inactive, a low charge carrier concentration is beneficial because SCE such as a leakage off-current increase with the first doping level, i.e. the doping level when the transistor 10 is inactive.

When the transistor 10 is active, a high charge carrier concentration is beneficial because the drive current of the device increases with the second doping level, i.e. the doping level when the transistor 10 is active.

The first doping level may extend beyond the first and second common regions 24, 27. For example, if the first doping level is chemically induced, it may be difficult to limit the chemical doping to only the first and second common regions 24, 27, such that it extends also to the first and second gap regions 25, 28 and a portion of the channel region 29. Technical effect of dynamic doping.

Because the second doping level is electrostatically increased by the gate voltage, the doping level of the first and second common regions 24, 27 are dynamically controlled in conjunction with the on-/off control of the transistor 10 by the gate 40.

The dynamic doping induced by the gate 40 allows for a low doping level as the first doping level, i.e. when the transistor 10 is inactive and a low charge carrier concentration is most beneficial, and a high doping level as the second doping level, i.e. when the transistor 10 is active and a high charge carrier concentration is most beneficial.

In the prior art, e.g. as in FIG. 1, the doping level of the source and drain regions are not dynamically changed and must therefore be balanced to alleviate the problems associated with each state.

Such a balancing is not necessary for a transistor 10 according to the present inventive concept, as the first and second doping level may be optimized relatively independently of each other.

The second doping level may correspond to or be higher than $N_{SD}$ of the prior art transistor and is sufficient to enable a high enough drive current.

The first doping level may be lower than a chemical or intrinsic doping level of the semiconductor layer 20.

An intrinsic doping level may be a doping level of $10^{10}$ $cm^{-3}$ to $10^{19}$ $cm^{-3}$. Chemical (i.e. non-electrostatic) doping may e.g. be in the magnitude of $10^{20}$ $cm^{-3}$.

The first doping level being lower than the intrinsic doping level of the semiconductor may be caused by the gate bias electrostatically depleting the otherwise intrinsically doped semiconductor 20 when the transistor 10 is inactive.

Similarly, the first doping level being lower than the chemical doping level of the semiconductor may be caused by the gate bias (at least partially) electrostatically depleting the otherwise chemically doped semiconductor 20 when the transistor 10 is inactive.

This electrostatic depletion may extend beyond the first and second common regions 24, 27 to also the channel region 29.

The semiconductor layer 20 may be formed with a uniform doping level.

If the semiconductor layer 20 is formed with a uniform intrinsic doping level, the semiconductor layer 20 does not comprise traditional source and drain regions as in the prior art transistor FIG. 1, which are defined by the regions of the semiconductor layer that are chemically doped.

These regions roughly correspond in the transistor 10 according to the present inventive concept to the regions of the semiconductor layer 20 that are dynamically doped when the transistor 10 is active, i.e. the first and second common regions 24, 27. However, as the doping level is electrostatically induced, the increased doping level is not confined to the regions of the semiconductor layer 20 where the gate 40 overlaps with the source and drain terminals 33, 36 and may extend slightly beyond these regions.

If there is no predetermined chemical doping of the semiconductor layer 20, then depending on the voltage applied over the gate 40, different charge carriers (electrons or holes) may be electrostatically doped in the first and second common regions 24, 27. Thereby, the same FET 10 may act as an NMOS or PMOS depending on the control of the gate 40.

The thickness of the semiconductor layer 20 is indicated by $t_s$ in FIGS. 1-5. The thickness may be anywhere between 5-50 nm. In the case of the $t_s$<20 nm, the semiconductor layer 20 may be considered a thin-film layer. In the embodiment shown, the semiconductor layer 20 has a thickness of 10 nm.

If the thickness of the semiconductor layer is sufficiently low, the gate 40 may induce a channel across the entire thickness of the semiconductor layer 20. Also, the gate 40 may induce an electrostatic doping of the first and second common regions 24, 27 of the semiconductor layer 20 that extends to the source and drain terminal 33, 36, thereby increasing electrostatic control.

Figure 3:
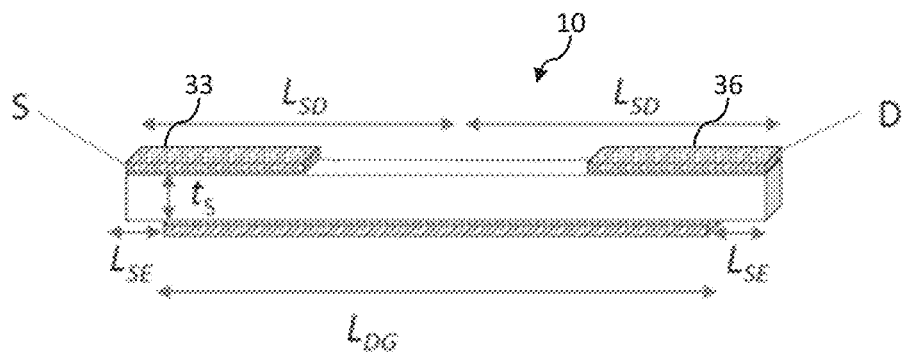
FIG. 3 is a schematic view of a field effect transistor with a smaller length than the transistor of FIG. 2.

FIG. 3 is a schematic view of a FET 10 according to the present inventive concept. The field effect transistor 10 is shown at the same scale as the transistors of FIGS. 1-2.

The transistor 10 of FIG. 3 has a shorter length than the transistor 10 of FIG. 2. In FIG. 3, the length of the transistor 10 is 28 nm, which approaches a theoretical minimum length of 22 nm.

The minimum length of a FET 10 according to the present inventive concept corresponds to the minimum length of a source and drain terminals 33, 36 and the minimum spacer distance between them, i.e. 8+8+6=22 nm using typical IRDS values.

The transistor 10 of FIG. 3 has twice the minimum length of distance between the source and drain terminals 33, 36. With $L_{SE}$=3 nm as in FIG. 2, $L_{DG}$ is 22 nm. In order to minimize $L_{DG}$, $L_{SE}$ may be increased proportionally to decreasing $L_{DG}$. The source and drain terminals 33, 36 of the transistor 10 of FIG. 3 are 12 nm apart.

Figure 4:
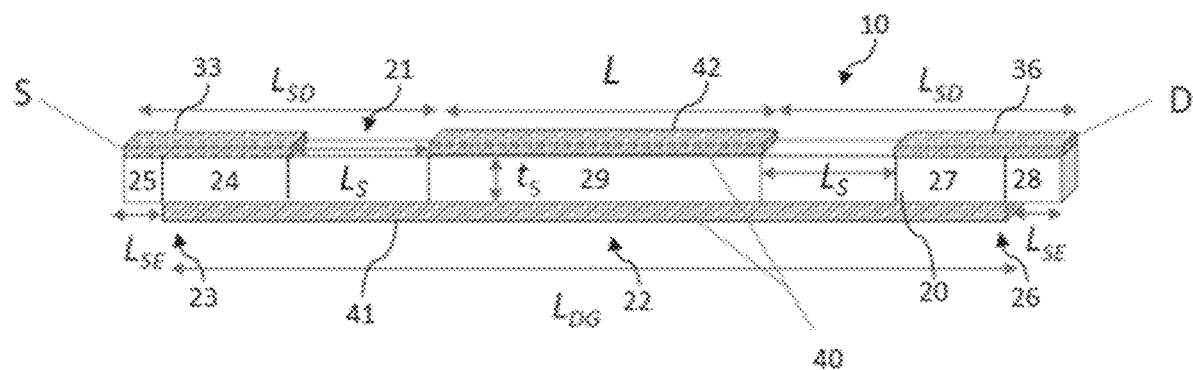
FIG. 4 is a schematic view of a field effect transistor with two gate portions.

FIG. 4 is a schematic view of a FET 10 according to the present inventive concept. The gate 40 comprises a first gate portion 41 extending along the second side 22 of the semiconductor layer 20, and a second gate portion 42 arranged along the first side 21 of the semiconductor layer 20. The first and second gate portions 41, 42 are controlled via a same gate terminal.

The first and second gate portions 41, 42 are electrically connected and jointly controlled with the same electrical signal via the single gate terminal.

The first and second gate portions 41, 42 may be formed in contact with each other, e.g. by extending towards a shared corner of the semiconductor layer 20. The first and second gate portions 41, 42 may be electrically connectable to the same via, going to the same gate terminal contact.

The second gate portion 42 may be formed in a separate process, or together with either the first gate portion 41.

The second gate portion 42 may be arranged in a similar manner as the gate of the prior art transistor of FIG. 1.

The second gate portion 42 in this embodiment is shorter than the first gate portion 41 and does not overlap with the source terminal 33 or drain terminal 36. Thereby, only the first gate portion 41 of the gate 40 induces an electrostatic doping of the first and second common regions 24, 27 of the semiconductor layer 20 when the FET 10 is switched to an active state. Both the first and second gate portions 41, 42 however jointly induce a channel in the channel region 29 of the semiconductor layer 20 when the FET 10 is switched to an active state.

By using a plurality of gate portions to induce a channel in the middle of the channel region 29, a better electrostatic control may be exerted over a subregion of the semiconductor 20 that otherwise has a lower charge carrier concentration than e.g. the first and second common regions 24, 27 when the FET 10 is in an active state. Thereby, a higher channel current may be achieved.

Figure 5:
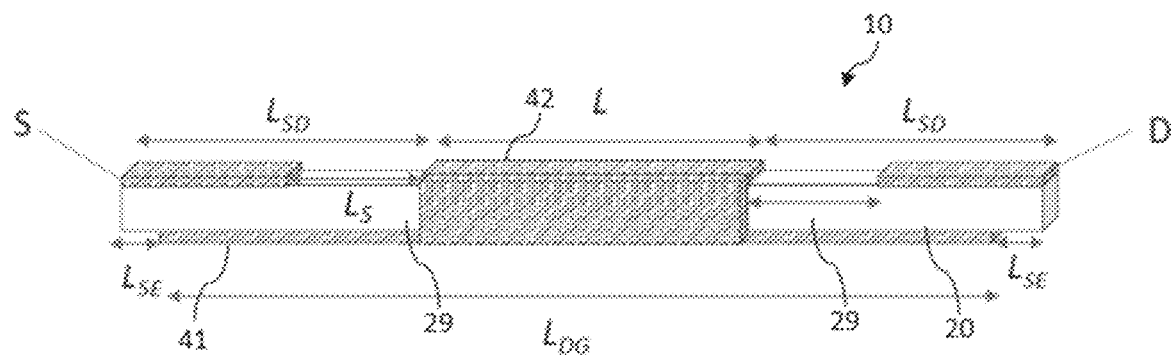
FIG. 5 is a schematic view of a field effect transistor with an all-around gate.

FIG. 5 is a schematic view of a FET 10 similar to the one in FIG. 4, with two additional gate portions along opposite sidewalls of the semiconductor layer 20. The four gate portions together form an all-around gate that induces a channel in the middle of the channel region 29.

By using even more gate portions to induce a channel in the middle of the channel region 29, an even better electrostatic control may be exerted.

Figure 6:
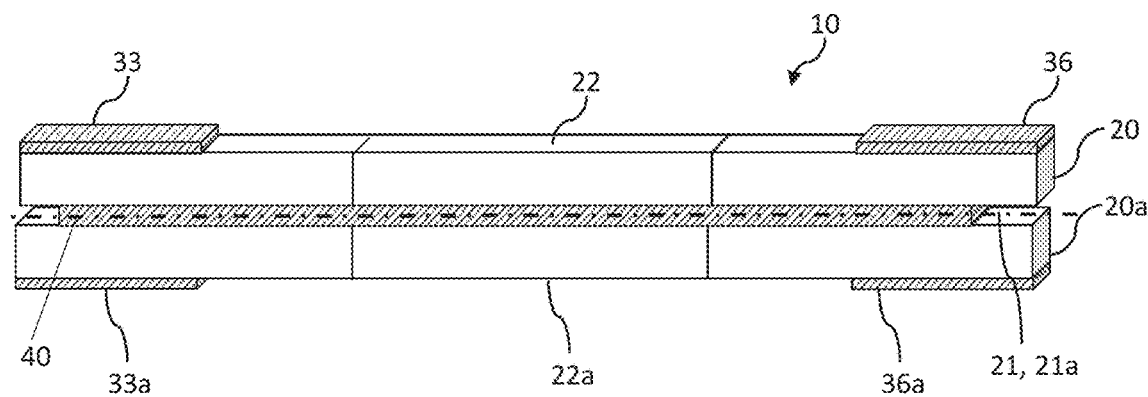
FIG. 6 is a schematic view of a field effect transistor with two semiconductor layers.

FIG. 6 is a schematic view of a FET 10 according to the present inventive concept. The FET 10 comprises a first and second semiconductor layer 20, 20a, that each correspond to the semiconductor layer 20 as previously discussed.

The source terminal comprises a first and second source portion 33, 33a and are electrically connected and jointly controlled with the same electrical signal via the single source terminal. The drain terminal comprises a first and second drain portion 36, 36a and are electrically connected and jointly controlled with the same electrical signal via the single drain terminal.

The first source and drain portions 33, 36 are arranged on the first side 21 of the first semiconductor layer 20 and correspond to the source and drain terminals 33, 36 of the FET 10 of FIG. 2. The second source and drain portions 33a, 36a are arranged on a first side 21a of the second semiconductor layer 20a and extend along a source region 23a and a drain region 26a respectively of the second semiconductor layer 20a.

The gate 40 is arranged on the second side 22 of the first semiconductor layer 20 and on a second side 22a of the second semiconductor layer 20a. The gate 40 is thereby shared by the first and second semiconductor layer 20, 20a.

The gate 40 defines a mirror plane of the FET 10 as indicated by the dashed line in FIG. 6. In alternative embodiments, the second semiconductor layer 20a is not symmetrical with the first semiconductor layer 20 and may have a different shape or thickness. The second source and drain portions 33a, 36a may also not be arranged symmetrically with the first source and drain portions 33, 36.

Depending on the embodiment, it may be beneficial to have symmetric or asymmetric channel characteristics in the first and second semiconductor layer 20, 20a.

The FET 10 may comprise more than two semiconductor layers 20, 20a by adding additional semiconductor layers in an analogous manner.

The second semiconductor layer 20a may be made from the same material as the first semiconductor layer 20.

By the use of two semiconductor layers 20, 20a thusly arranged, the shared gate 40 may control the doping and the flow of charges through both the first and second semiconductor layers 20, 20a, thereby effectively doubling the drive current of the FET 10.

Figure 7:
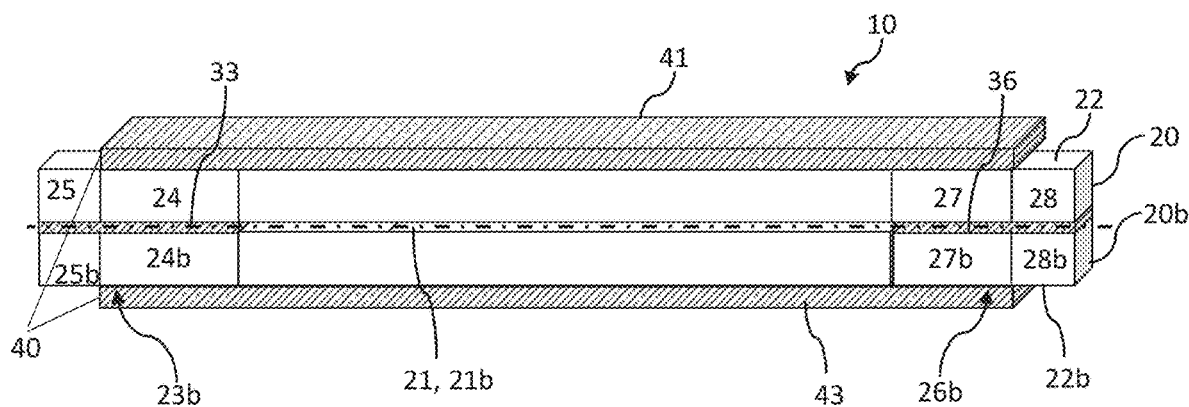
FIG. 7 is a schematic view of a field effect transistor with two semiconductor layers.

FIG. 7 is a schematic view of a FET 10 according to the present inventive concept. The FET 10 comprises a first and third semiconductor layer 20, 20b, that each correspond to the semiconductor layer 20 as previously discussed.

The gate 40 comprises a first and third gate portion 41, 43 and are electrically connected and jointly controlled with the same electrical signal via a single gate terminal.

The first gate portion 41 is arranged on the second side 22 of the first semiconductor layer 20 and correspond to the gate 40 of the FET 10 as previously discussed. The third gate portion 43 is arranged on the second side 22b of the third semiconductor layer 20b and extends along a second side 22b of the third semiconductor layer 20b.

The third gate portion 43 is further arranged to overlap with a first and second common region 24b, 27b of the third semiconductor layer 20b, the first common region 24b forming a sub-region of a source region 23b of the third semiconductor layer 20b and the second common region 27b forming a sub-region of a drain region 26b of the third semiconductor layer 20b.

The source region 23b of the third semiconductor layer 20b further comprises a first gap region 25b which the third gate portion 43 does not overlap and the drain region 26b of the third semiconductor layer 20b further comprises a second gap region 28b which the third gate portion 43 does not overlap.

The source and drain terminals 33, 36 are arranged on the first side 21 of the first semiconductor layer 20 and on a first side 21b of the third semiconductor layer 20b. The source and drain terminals 33, 36 are thereby shared by the first and third semiconductor layers 20, 20b.

The source and drain terminals 33, 36 define a mirror plane of the FET 10 as indicated by the dashed line in FIG. 7. In alternative embodiments, the third semiconductor layer 20b is not symmetrical with the first semiconductor layer 20 and may have a different shape or thickness. The third gate portion 43 may also not be arranged symmetrically with the first gate portion 41.

Depending on the embodiment, it may be beneficial to have symmetric or asymmetric channel characteristics in the first and third semiconductor layer 20, 20b.

The FET 10 may comprise more than two semiconductor layers 20, 20b by adding additional semiconductor layers in an analogous manner.

The third semiconductor layer 20b may be formed separately from or jointly with the first semiconductor layer 20. The third semiconductor layer 20b may be made from the same material as the first semiconductor layer 20.

By the use of two semiconductor layers 20, 20b thusly arranged, the shared source and drain terminals 33, 36 may introduce charge carriers to both the first and third semiconductor layers 20, 20b, thereby effectively doubling the drive current of the FET 10.

Figure 8:
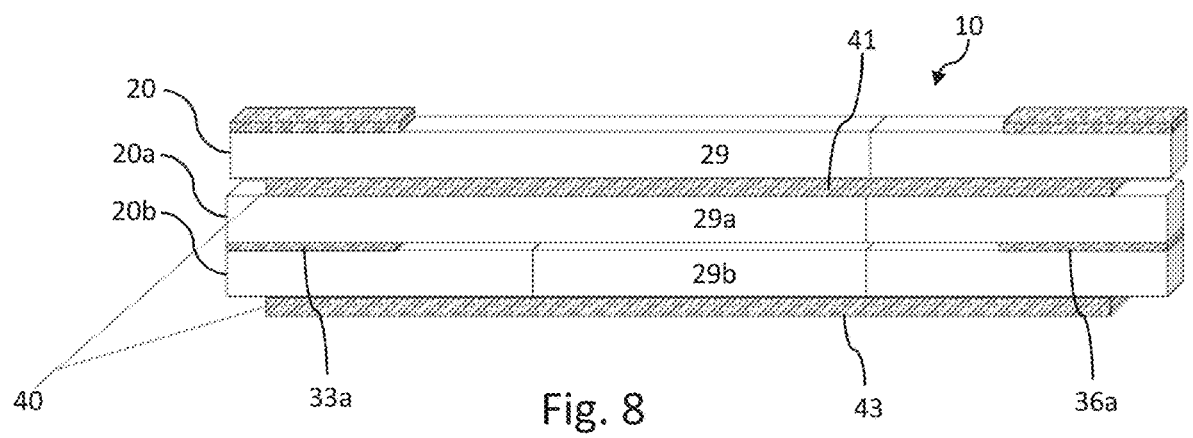
FIG. 8 is a schematic view of a field effect transistor with a stack of semiconductor layers.
Figure 9:
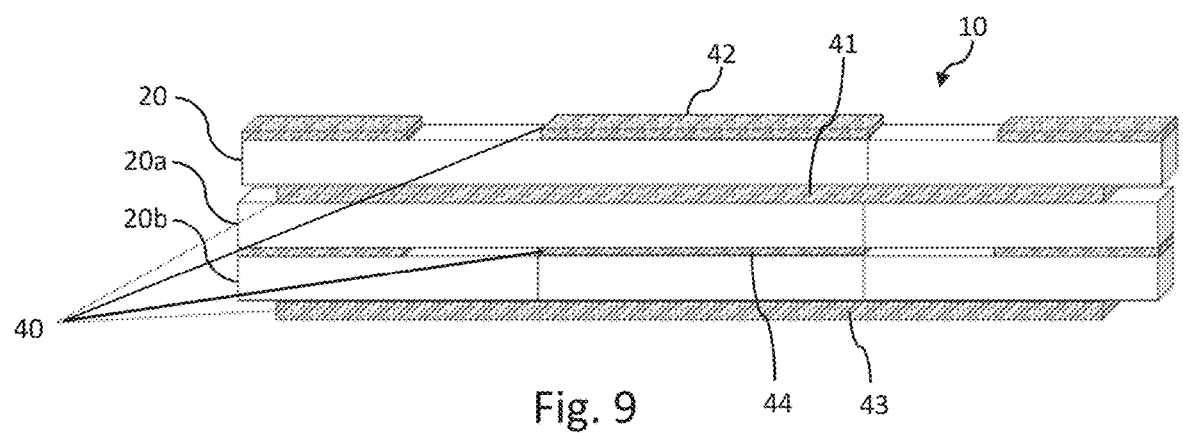
FIG. 9 is a schematic view of a field effect transistor with a stack of semiconductor layers and additional gate portions.
Figure 10:
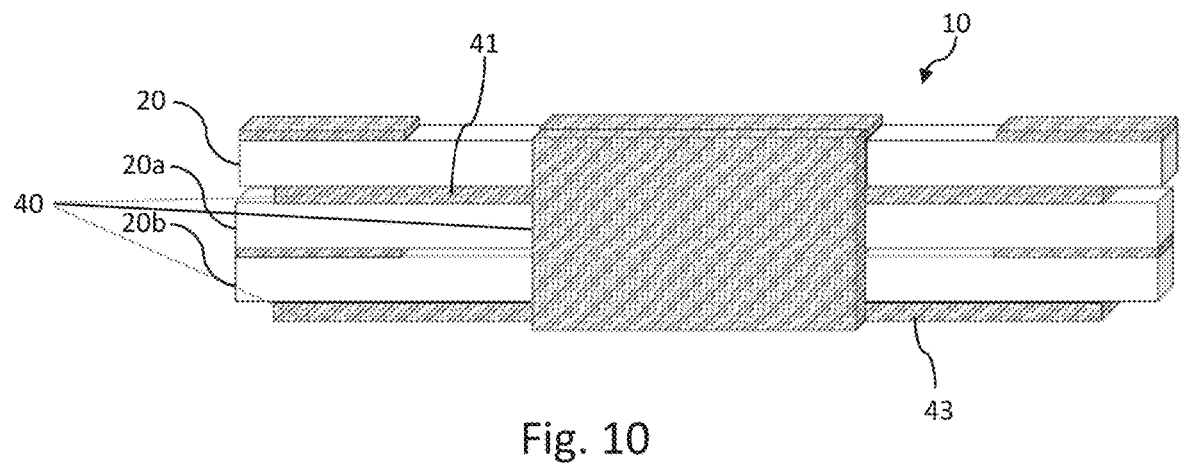
FIG. 10 is a schematic view of a field effect transistor with a stack of semiconductor layers and an all-around gate.

FIGS. 8-10 are schematic views of different FET 10 according to the present inventive concept. The FETs 10 each comprise three semiconductor layers 20 and different numbers of gate portions.

The three semiconductor layers 20, 20a, 20b are arranged according to a combination of the embodiments of FIGS. 6-7. Thereby, a shared first gate 41 portion is arranged between the first and second semiconductor layer 20, 20a and shared second source and drain portions 33a, 36a are arranged between the second and third semiconductor layers 20a, 20b.

By the use of three semiconductor layers 20, 20a, 20b thusly arranged, the shared gate, source and drain portions 41, 33a, 36a enable an electrostatic doping of the first and second common regions of each of the three semiconductor layers 20, 20a, 20b and induction of a channel in a channel region 29, 29a, 29b of each of the three semiconductor layers 20, 20a, 20b, thereby effectively tripling the drive current of the FET 10.

FIG. 8 shows a FET 10 comprising a first and third gate portion 41, 43. The first gate portion 41 is shared by the first and second semiconductor layers 20, 20a.

FIG. 9 shows a FET 10 that, compared to the FET 10 of FIG. 8, further comprises a second and fourth gate portion 42, 44. The fourth gate portion 44 is shared by the second and third semiconductor layers 20a, 20b.

FIG. 10 shows a FET 10 that, compared to the FET 10 of FIG. 9, further comprises two sidewall gate portions that extend along the entire height of the FET 10, covering the sidewalls of each of the first, second and third semiconductor layers 20, 20a, 20b.

Figure 11:
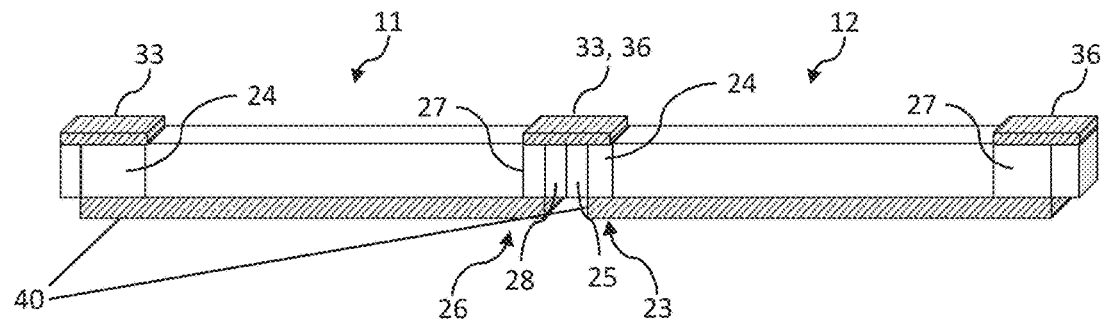
FIG. 11 is a schematic view of a field effect transistor arrangement.

FIG. 11 is a schematic view of a FET arrangement. The FET arrangement comprises a first and second FET 11, 12 according to the present inventive concept arranged along the same semiconductor layer 20.

The first gap region 25 of the second field-effect transistor 12 is adjacent the second gap region 28 of the first field-effect transistor 11. The two adjacent gap regions 25, 28 are each 3 nm long and together form a region of the semiconductor layer 20 with a length of 6 nm without overlap from the respective gates 40 of the first and second FET 11, 12.

By the combined length of the two adjacent gap regions 25, 28, a minimum (spacer) distance of 6 nm for electrically separating the respective gates 40 of the first and second FET 11, 12 is achieved. This distance corresponds to a typical $L_S$ value forecast by IRDS. This allows the respective gates 40 of the first and second FET 11, 12 to be individually controlled.

By such a FET arrangement, several FETs 11, 12 may be arranged adjacent to each other in an efficient manner.

The FET arrangement further comprises three source and drain terminals 33, 36. Both the first and second FET 11, 12 has a source terminal 33 to the left and a drain terminal 36 to the right in FIG. 11. The drain terminal 36 of the first FET 11 is the same terminal as the source terminal 33 of the second FET 12.

By the first and second FET 11, 12 sharing a terminal acting respectively as a drain and source terminal 33, 36, the charge carriers of each of the FETs 11, 12 are different, i.e. if the first FET 11 is an NFET the second FET 12 is a PFET and vice versa. The voltage applied by the gate 40 of the first FET 11 is thereby of an opposite sign compared to the voltage applied by the gate 40 of the second FET 12.

The FET arrangement may be formed in a similar manner as a single FET 10, e.g. by forming the respective gate 40 of the first and second FET 11, 12 at the same time and extending the length of the semiconductor layer 20 as compared to the single FET 10.

The shared source and drain terminal 33, 36 of the FET arrangement is formed with a minimum length and is overlapping with both the gates 40 of the first and second FET 11, 12. Thereby, the second common region 27 of the first FET 11 and the first common region 24 of the second FET 12 are shorter than the first common region 24 of the first FET 11 and the second common region 27 of the second FET 12.

It is noted that while the first and second FET 11, 12 share a semiconductor layer 20 and a source and drain terminal 33, 36, the region of the semiconductor layer 20 that is part of the first FET 11 and which the drain terminal 36 overlaps is considered a drain region 26 of the first FET 11 and the region of the semiconductor layer 20 that is part of the second FET 12 and which the same terminal now acting as a source terminal 33 overlaps is considered a source region 23 of the second FET 12.

Figure 12:
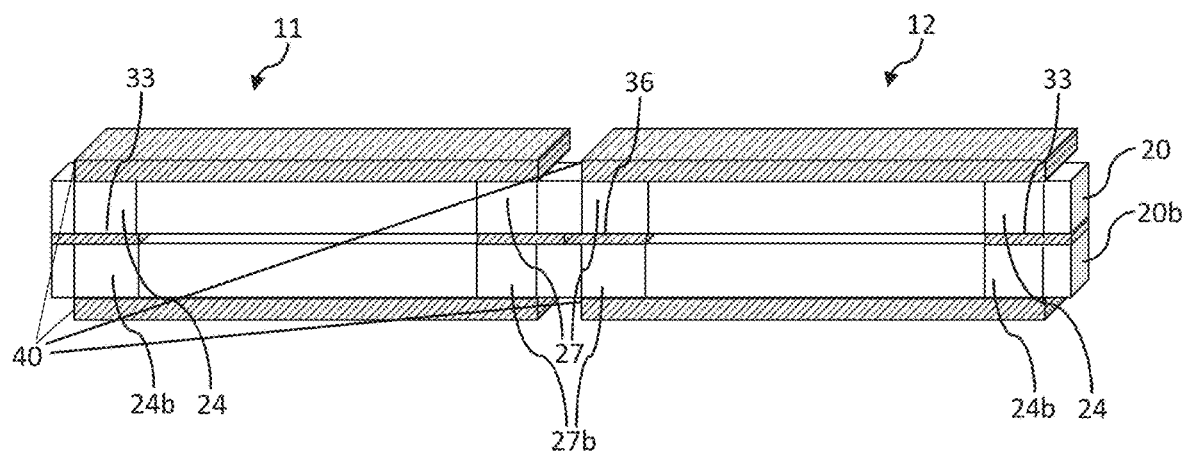
FIG. 12 is a schematic view of a field effect transistor arrangement with two semiconductor layers.

FIG. 12 is a schematic view of a FET arrangement. The FET arrangement comprises a first and second FET 11, 12 according to the present inventive concept, each comprising the same first and third semiconductor layers 20, 20b.

The first and second FET 11, 12 work in a similar manner as the FET 10 of FIG. 7 and are arranged together in a similar manner as the FET arrangement of FIG. 11.

A difference of the FET arrangement of FIG. 12 as compared to the FET arrangement of FIG. 11 is that the shared terminal is a drain terminal 36. The first FET 11 thereby has a source terminal 33 to the left and a drain terminal 36 to the right in FIG. 12 and the second FET 12 has a drain terminal 36 to the left and a source terminal 33 to the right in FIG. 12.

Both the first and second FET 11, 12 of FIG. 12 have the same charge carrier, i.e. if the first FET 11 is an NFET the second FET 12 is also an NFET and vice versa if the first FET 11 is a PFET. The voltage applied by the gate 40 of the first FET 11 also has the same sign as the voltage applied by the gate 40 of the second FET 12.

The shared drain terminal 36 is twice as long as the respective source terminal 33 of the first and second FETs 11, 12. The second common regions 27, 27b of the first and second FETs 11, 12 are the same length as the first common regions 24, 24b of the first and second FETs 11, 12.

The first and second FET 11, 12 may be formed separately and subsequently joined together. Alternatively, the shared drain terminal 36 may be integrally formed.

Figure 13:
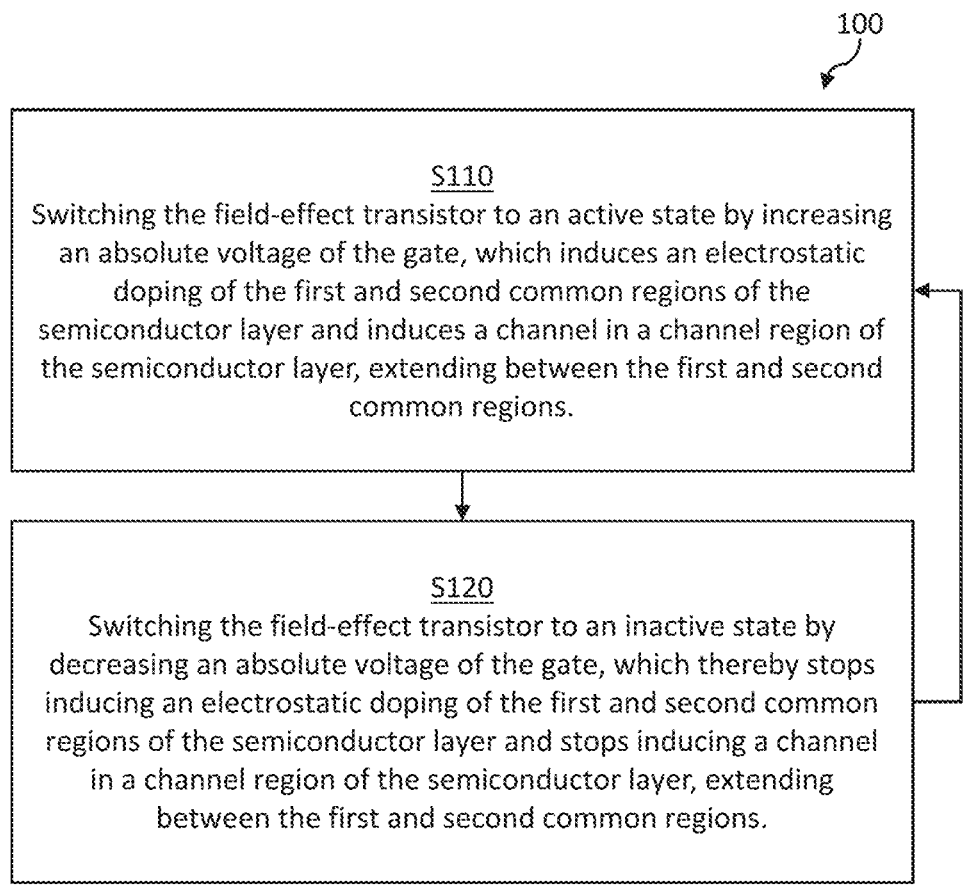
FIG. 13 illustrates method steps for controlling a field effect transistor according to the present inventive concept.

FIG. 13 illustrates method steps for controlling a field effect transistor according to the present inventive concept. The two steps S110, S120 of the method 100 are taken in alternate order to turn the FET on or off.

The step S110 of switching the FET to an active state comprises increasing an absolute voltage of the gate, which induces an electrostatic doping of the first and second common regions of the semiconductor layer and induces a channel in a channel region of the semiconductor layer, extending between the first and second common regions.

The voltage applied to the gate and the type (e.g. slope) of increase may depend on the embodiment. The voltage applied may be positive or negative.

The step S120 of switching the FET to an inactive state comprises decreasing an absolute voltage of the gate, which thereby decreases the amount of electrostatic doping of the first and second common regions of the semiconductor layer and stops inducing a channel in a channel region of the semiconductor layer, extending between the first and second common regions.

The type of decrease in absolute voltage may depend on the embodiment. The resulting decreased voltage may be 0 V.

In the above the inventive concept has mainly been described with reference to a limited number of examples. However, as is readily appreciated by a person skilled in the art, other examples than the ones disclosed above are equally possible within the scope of the inventive concept, as defined by the appended claims.

The invention claimed is:

1. A device comprising a field-effect transistor and a controller, the field effect transistor comprising:
   a semiconductor layer;
   a source terminal, a drain terminal and a single gate terminal, the single gate terminal being connected to a gate comprising at least a first gate portion;
   wherein the source and drain terminals are arranged on a first side of the semiconductor layer and the first gate portion is arranged on a second side of the semiconductor layer opposite the first side;
   wherein the semiconductor layer comprises a source region along which the source terminal abuts the semiconductor layer and a drain region along which the drain terminal abuts the semiconductor layer;
   wherein the first gate portion and the source terminal are arranged to overlap with a first common region of the semiconductor layer and the first gate portion and the drain terminal are arranged to overlap with a second common region of the semiconductor layer, the first common region forming a sub-region of the source region and the second common region forming a sub-region of the drain region, wherein the source region further comprises a first gap region which the first gate portion does not overlap and the drain region further comprises a second gap region which the first gate portion does not overlap;

the controller being configured to switch the field-effect transistor to an active state by applying a voltage to the gate, the applied voltage in the active state inducing an electrostatic doping of the first common region and the second common region of the semiconductor layer and inducing a channel in a channel region of the semiconductor layer, wherein the channel region extends between the first common region and the second common region; and switch the field-effect transistor to an inactive state by applying a voltage to the gate, the applied voltage in the inactive state reducing an amount of electrostatic doping of the first common region and the second common region of the semiconductor layer and stopping inducing the channel in the channel region of the semiconductor layer;

wherein the first common region and the second common region have a respective first doping level when the field-effect transistor is in the inactive state, and a respective second doping level which is electrostatically increased relative to the respective first doping level when the field-effect transistor is in the active state; and wherein the respective first doping level is lower than a chemical or an intrinsic doping level of the semiconductor layer before addition of the source terminal, the drain terminal and the single gate terminal to the semiconductor layer.

2. The device according to claim 1, wherein the semiconductor layer is formed with a uniform doping level.

3. The device according to claim 1, wherein the source terminal and the drain terminals are at most 24 nm apart.

4. The device according to claim 1, wherein the semiconductor layer is a thin-film layer.

5. The device according to claim 1, wherein the gate further comprises a second gate portion arranged along the first side of the semiconductor layer, a third side of the semiconductor layer, or both, the first gate portion and the second gate portion being controlled via the single gate terminal.

6. The device according to claim 1, wherein said semiconductor layer forms a first semiconductor layer and the field-effect transistor further comprises a second semiconductor layer having a first side and a second side;

wherein the source terminal comprises a first source portion and the drain terminal comprises a first drain portion, the first source portion and the first drain portion arranged on the first side of the first semiconductor layer;

wherein the first gate portion is arranged on the second side of the second semiconductor layer; and the field-effect transistor further comprises a second source portion and a second drain portion arranged on the first side of the second semiconductor layer and extending along a source region and a drain region respectively of the second semiconductor layer, the first and second source portions being controlled via the source terminal and the first and second drain portions being controlled via the drain terminal.

7. The device according to claim 1, wherein said semiconductor layer forms a first semiconductor layer and the field-effect transistor further comprises a third semiconductor layer having a first side and a second side;

wherein the source terminal and drain terminal are arranged on the first side of the third semiconductor layer; and the gate further comprises a third gate portion extending along the second side of the third semiconductor layer, the first gate portion and the third gate portion being controlled via a same the gate terminal; and wherein the third gate portion is arranged to overlap with a first common region and a second common region of the third semiconductor layer, the first common region forming a sub-region of a source region of the third semiconductor layer and the second common region forming a sub-region of a drain region of the third semiconductor layer, wherein the source region of the third semiconductor layer further comprises a first gap region which the third gate portion does not overlap and the drain region of the third semiconductor layer further comprises a second gap region which the third gate portion does not overlap.

8. A method for controlling a device comprising a field-effect transistor and a controller, the field effect transistor comprising:

a semiconductor layer;

a source terminal, a drain terminal and a single gate terminal, the single gate terminal being connected to a gate comprising at least a first gate portion;

wherein the source and drain terminals are arranged on a first side of the semiconductor layer and the first gate portion is arranged on a second side of the semiconductor layer opposite the first side;

wherein the semiconductor layer comprises a source region along which the source terminal abuts the semiconductor layer and a drain region along which the drain terminal abuts the semiconductor layer;

wherein the first gate portion and the source terminal are arranged to overlap with a first common region of the semiconductor layer and the first gate portion and the drain terminal are arranged to overlap with a second common region of the semiconductor layer, the first common region forming a sub-region of the source region and the second common region forming a sub-region of the drain region, wherein the source region further comprises a first gap region which the first gate portion does not overlap and the drain region further comprises a second gap region which the first gate portion does not overlap;

the controller being configured to switch the field-effect transistor to an active state by applying a voltage to the gate, the applied voltage in the active state inducing an electrostatic doping of the first common region and the second common region of the semiconductor layer and inducing a channel in a channel region of the semiconductor layer, wherein the channel region extends between the first common region and the second common region; and switch the field-effect transistor to an inactive state by applying a voltage to the gate, the applied voltage in the inactive state reducing an amount of electrostatic doping of the first common region and the second common region of the semiconductor layer and stopping inducing the channel in the channel region of the semiconductor layer;

wherein the first common region and the second common region have a respective first doping level when the field-effect transistor is in the inactive state, and a respective electrostatically increased second doping level when the field-effect transistor is in the active state; and wherein the respective first doping level is lower than a chemical or an intrinsic doping level of the semiconductor layer before addition of the source terminal, the drain terminal and the single gate terminal to the semiconductor layer;

the method comprising switching the field-effect transistor to an active state by controlling a voltage of the gate, which induces an electrostatic doping of the first common region and the second common region of the semiconductor layer and induces a channel in a channel region of the semiconductor layer, extending between the first common region and the second common region.

9. A method according to claim 8, further comprising switching the field-effect transistor to an inactive state by controlling a voltage of the gate, which reduces the amount of electrostatic doping of the first common region and the second common region of the semiconductor layer and stops inducing the channel in the channel region of the semiconductor layer, extending between the first common region and the second common region.

10. A device arrangement comprising:
  a first device comprising a first field-effect transistor and a first controller, and a second device comprising a second field-effect transistor and a second controller, each of the field effect transistors comprising:
  a semiconductor layer;
  a source terminal, a drain terminal and a single gate terminal, the single gate terminal being connected to a gate comprising at least a first gate portion;
  wherein the source and drain terminals are arranged on a first side of the semiconductor layer and the first gate portion is arranged on a second side of the semiconductor layer opposite the first side;
  wherein the semiconductor layer comprises a source region along which the source terminal abuts the semiconductor layer and a drain region along which the drain terminal abuts the semiconductor layer;
  wherein the first gate portion and the source terminal are arranged to overlap with a first common region of the semiconductor layer and the first gate portion and the drain terminal are arranged to overlap with a second common region of the semiconductor layer, the first common region forming a sub-region of the source region and the second common region forming a sub-region of the drain region, wherein the source region further comprises a first gap region which the first gate portion does not overlap and the drain region further comprises a second gap region which the first gate portion does not overlap;
  each controller individually configured to switch the corresponding field-effect transistor to an active state by applying a voltage to the gate, the applied voltage in the active state inducing an electrostatic doping of the first common region and the second common region of the semiconductor layer and inducing a channel in a channel region of the semiconductor layer, wherein the channel region extends between the first common region and the second common region; and switch the field-effect transistor to an inactive state by applying a voltage to the gate, the applied voltage in the inactive state reducing an amount of electrostatic doping of the first common region and the second common region of the semiconductor layer and stopping inducing the channel in the channel region of the semiconductor layer;
  wherein the first common region and the second common region have a respective first doping level when the field-effect transistor is in the inactive state, and a respective second doping level which is electrostatically increased relative to the respective first doping level when the field-effect transistor is in the active state; and
  wherein the respective first doping level is lower than a chemical or an intrinsic doping level of the semiconductor layer before addition of the source terminal, the drain terminal and the single gate terminal to the semiconductor layer;
  wherein the semiconductor layer of the first field-effect transistor is the same as the semiconductor layer of the second field-effect transistor;
  wherein the first gap region of the second field-effect transistor is adjacent the first gap region or the second gap region of the first field-effect transistor; and
  wherein the gate of the first field-effect transistor and the gate of the second field-effect transistor are configured to be individually controlled.

11. The field-effect transistor arrangement according to claim 10, wherein the source terminal of the second field-effect transistor and the source terminal or the drain terminal of the first field-effect transistor are integrally formed.

* * * * *